Figure 1:
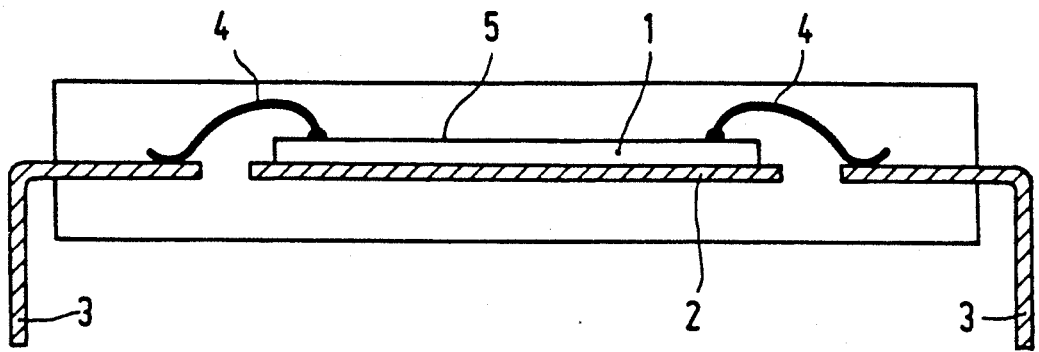

United States Patent [19]

Gootzen et al.

[11] Patent Number: 5,043,793
[45] Date of Patent: Aug. 27, 1991

[54] SEMICONDUCTOR DEVICE WITH STRESS RELIEF COATING AT THE PERIPHERY OF THE DEVICE

[75] Inventors: Wilhelmus F. M. Gootzen; Gwendolyn A. Luiten; Hans Van Wijngaarden; Cornelis J. H. De Zeeuw, all of Eindhoven, Netherlands

[73] Assignee: U.S. Philips Corporation, New York, N.Y.

[21] Appl. No.: 554,631

[22] Filed: Jul. 17, 1990

[30] Foreign Application Priority Data

Aug. 7, 1989 [NL] Netherlands ..................... 8902018

[51] Int. Cl.⁵ .................. H01L 23/30; H01L 23/08
[52] U.S. Cl. .................................. 357/72; 357/74
[58] Field of Search ............................ 357/72, 74

[56] References Cited
FOREIGN PATENT DOCUMENTS

| 0260360 | 3/1988 | European Pat. Off. ............. 357/72 |
| 0275588 | 7/1988 | European Pat. Off. ............. 357/72 |
| 57-48252 | 3/1982 | Japan .................................. 357/72 |
| 60-206153 | 10/1985 | Japan .................................. 357/72 |
| 61-10243 | 1/1986 | Japan .................................. 357/72 |

Primary Examiner—Jerome Jackson, Jr.
Attorney, Agent, or Firm—Paul R. Miller

[57] ABSTRACT

A semiconductor device comprising a semiconductor element (1), a carrier member (2) for the semiconductor element, electrical connection conductors (3) and wire connections (4) between connection areas (7) on the semiconductor element and the electrical connection conductors is provided with a coating (6, 9) on the surface of the semiconductor element remote from the carrier member, where the active circuit is situated, and is enveloped with a synthetic material. The coating (6, 9) is electrically insulating and has an elasticity for absorbing shear stresses which occur between the active surface (5) of the semiconductor element and the envelope. To prevent pattern shift as well as wire fracture or tearing off of the wire, the coating (9) is present only at the outer edge of the active surface of the semiconductor element (1), leaving the central portion of this surface exposed with the coating (9) extending beyond or around the connection areas (7) for the wire connections.

8 Claims, 3 Drawing Sheets

SEMICONDUCTOR DEVICE WITH STRESS RELIEF COATING AT THE PERIPHERY OF THE DEVICE

The invention relates to a semiconductor device comprising a semiconductor element, a carrier member for the semiconductor element, electrical connection conductors, wire connections between connection areas on the semiconductor element and the electrical connection conductors, a coating on the surface of the semiconductor element remote from the carrier member, on which surface the active circuit is located, and an envelope of synthetic material from which a portion of the connection conductors projects to the exterior, the coating being electrically insulating and having an elasticity for accommodating shear stresses which occur between the active surface of the semiconductor element and the envelope, which shear stresses occur substantially parallel to the surface covered with the coating. Such a semiconductor device is known from European patent application No. EP-A-0260360.

As the dimensions of a semiconductor element, such as an integrated circuit, increase, while the dimensions of the envelope of the semiconductor element remain the same, mechanical problems can arise. One of these problems relates to the mechanical damage which can be caused to the surface of a semiconductor element in the area where the actual circuit is located. The invention deals with this problem, especially with what is often referred to in the literature as "pattern shift".

Pattern shift is understood to mean the shifting of aluminium tracks toward the center of the semiconductor element; and it refers to the wiring present at the surface of the semiconductor element. The pattern shift is caused by the difference in the thermal coefficient of expansion between the semiconductor element material, for example, silicon and the envelope material, for example, epoxy resin. Thermal loads occur when the semiconductor element is being enveloped in the synthetic material, especially during cooling down of the synthetic material, which has reached a temperature in the order of 175° C. Thermal loads occur to a much higher degree when alternating temperature tests are carried out. In these tests, in which the quality of the entire semiconductor device is checked under strongly fluctuating thermal conditions, the semiconductor device is subjected to a large number of temperature change cycles between a value well below 0° C., for example, −65° C. and a value well above 0° C., for example, +150° C. Pattern shift may also arise under thermally alternating operating conditions, especially in the case of numerous alternations.

A reduction of the shear stresses at the surface of the semiconductor element, therefore, is important. Various methods can be followed for this. One of the efforts is to change the texture and polymerizing technology of the synthetic material of the envelope, so that so-called "low stress plastics" can be obtained. It is true that the occurrence of stresses is reduced by this to some extent, but the properties of such synthetic envelope materials are worse in other respects, for example, as to their moisture resistance.

A more usual solution is sought by the application of polymer coating layers on the active surface of the semiconductor element. A separating layer having a certain elasticity is applied between the surface of the semiconductor element and the synthetic envelope, which layer is to absorb the stresses. The coating may be applied on finished separate semiconductor elements before these are enveloped (chip coating, which is obviously expensive), in which method the entire surface of the semiconductor element is coated, or it may be applied in a pattern on the semiconductor wafer before the latter is divided into separate elements (wafer coating). In this method, which is much cheaper, the contact areas for the connection wires yet to be applied, and possibly also the scribing or sawing lanes, are left free, while the further surface is entirely coated. If a relatively "soft" coating is used (Young's modulus preferably, but not necessarily, below approximately 100 MPa), shear stresses are satisfactorily absorbed. The European patent application EP-A-0260360 gives an example of this. If a relatively thick coating is applied for this, it proves to be possible that the connection wires can be pulled apart. To prevent this, EP-A-0260360 proposes the use of a thin coating layer so that the hemispherical connection point of the wire with the connection area on the semiconductor element is not completely covered and forces are applied mainly to this hemispherical connection point. The forces occurring due to the shift of the epoxy envelope relative to the semiconductor element are now absorbed by the hemispherical connection, which has a much greater surface area than the wire cross-section. This leads, however, especially in semiconductor elements of larger dimensions where the forces bearing on the connection areas are very considerable, to the problem that the connection point can be torn off of the connection area.

The invention has for its object to provide a semiconductor device in which pattern shift is prevented by simple and inexpensive means, while at the same time the breaking of connection wires and tearing off connections in the prior art is eliminated.

According to the invention, this object is achieved in that the coating absorbing the shear stresses is situated at the outer edge of the active surface of the semiconductor element, thus leaving the central portion of this surface exposed, the coating extending to beyond or around the connection areas for the wire connections.

The invention is based on the recognition that measures to counter pattern shift should be taken only where they are necessary. A more favourable distribution of the forces occurring in the semiconductor device can then be achieved.

The envelope of synthetic material adheres directly to the exposed central portion of the semiconductor element in the device according to the invention. Shear stresses can occur in the semiconductor element there in the case of thermal loads, but these shear stresses are of a relatively low strength and cause no pattern shift. At the outer edge of the semiconductor element, where the shear stresses would be greatest without a coating, the shear stresses are absorbed by the coating to be applied there between the semiconductor element and the envelope. In this way pattern shift is prevented in the critical spots. Owing to the measures according to the invention, furthermore, the extent of the displacement of the synthetic envelope relative to the semiconductor element over the coated areas is much smaller than in the case of an overall coating of the semiconductor element. The force bearing on the wire connections or the pulling force at the wire itself is thus considerably less than in the case of an overall coating. By this it is achieved that both pattern shift is prevented and wire fracture, or tearing off the connection, will not occur.

The coating present at the outer edge need only cover an area of small width. It is practical for the coating to have an oval shape at its inner edge. The coating may be applied over a full circumference area, but it is also possible for the coating to be applied locally in the critical spots only.

It is useful, both for manufacturing reasons and for reasons of strength, if the connection areas for the connection wires are free from coating.

These and further embodiments of the invention will be explained in more detail with reference to the drawing.

Figure 2:
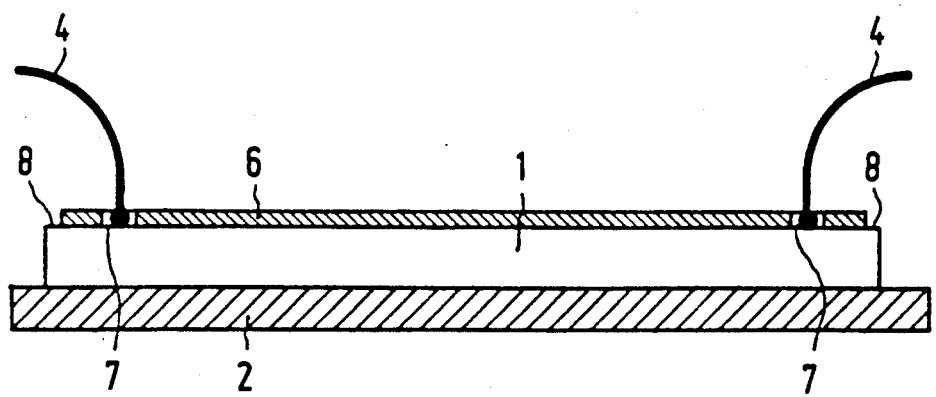
Figure 3:
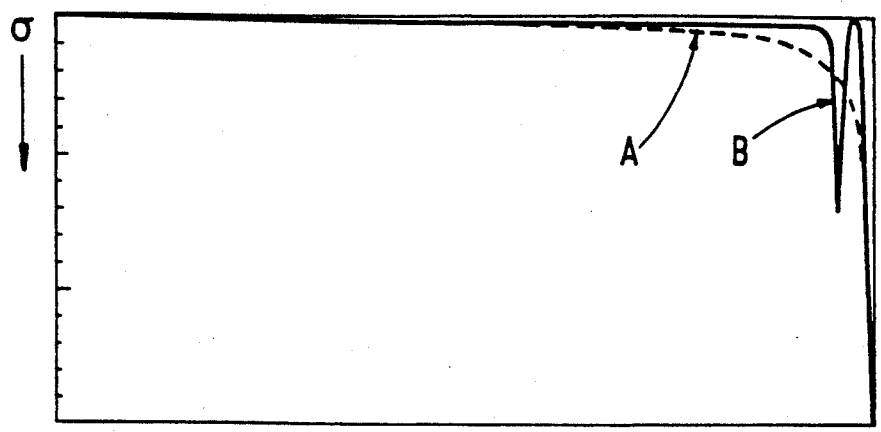
Figure 4:
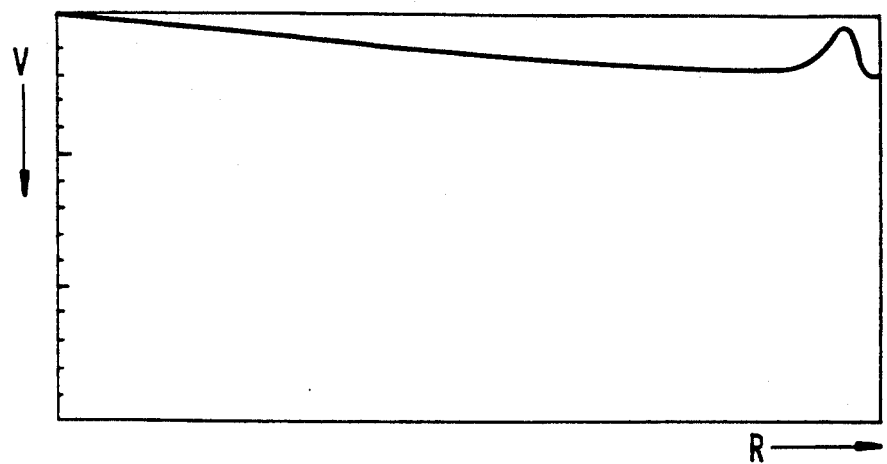
Figure 5:
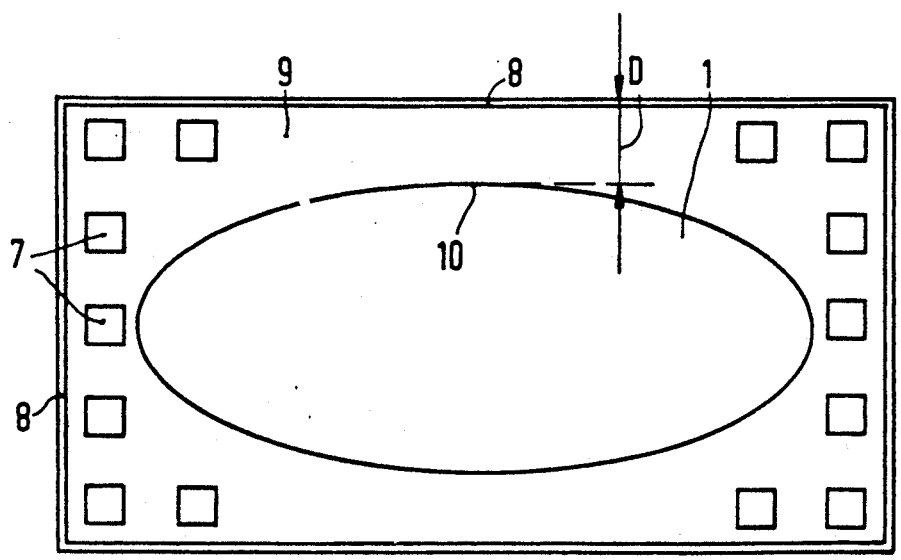
Figure 6:
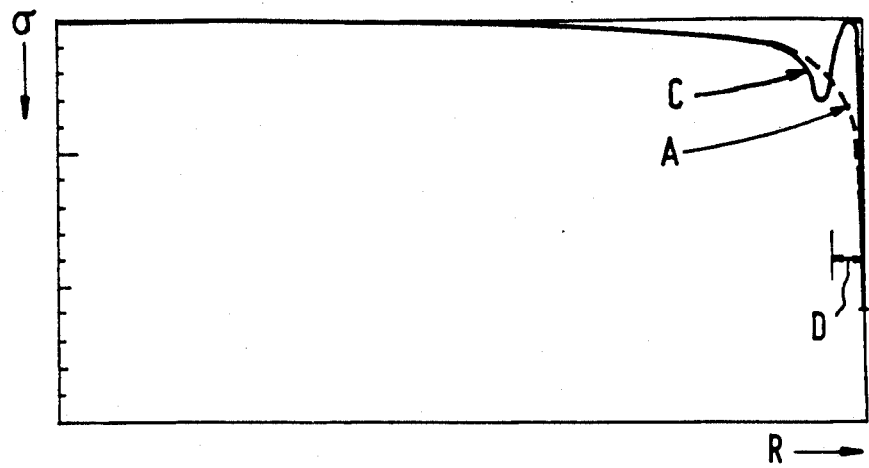
Figure 7:
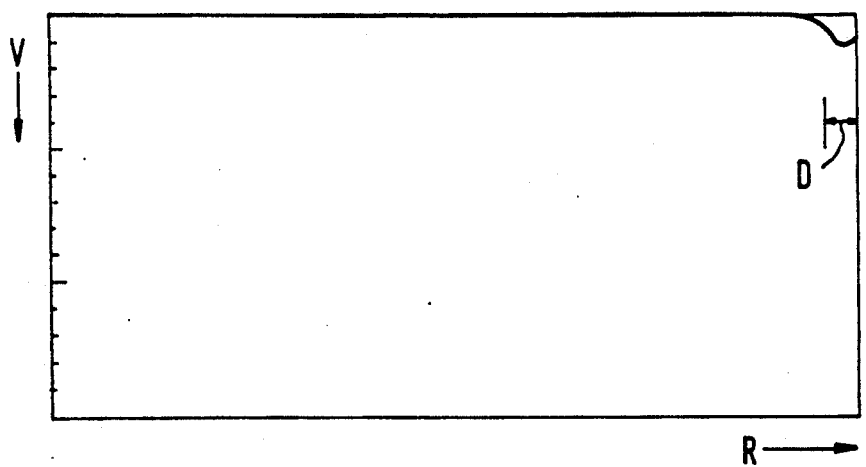

In the drawing:

FIG. 1 shows a diagrammatic picture of a conventional semiconductor device,

FIG. 2 shows a diagrammatic picture of the semiconductor device with the surface of the semiconductor device being provided with a coating, FIG. 3 shows a graph depicting the stress development at the surface of the semiconductor element according to the prior art, FIG. 4 shows a graph depicting the displacement of the top of the coating relative to the semiconductor element for the coating according to FIG. 2, FIG. 5 shows a plan view of a semiconductor element provided with a coating according to the invention, FIG. 6 shows a graph depicting the stress development at the surface of a semiconductor element with peripheral coating, and FIG. 7 shows a graph of the displacement of the enveloping synthetic material relative to the semiconductor element according to the invention.

FIG. 1 shows a conventional embodiment of a semiconductor device with an envelope made of synthetic material. A semiconductor element 1 is mounted on a carrier member 2 of a lead frame. This mounting is effected, for example, by means of solder or an electrically conducting glue. Connection conductors 3 also form part of the lead frame. The electrical connection between the semiconductor element 1 and the connection conductors 3 consists of connection wires 4; i.e. a wire 4 leads from each connection area (bond pad) on the semiconductor element 1 to a connection conductor 3. A frequently used connection technique is ball bonding or nailhead bonding. The semiconductor element 1, the connection wires 4 and a portion of the lead frame 2, 3 are enclosed in an envelope of synthetic material, for example an epoxy resin.

A clear tendency exists in practice toward increased dimensions of the semiconductor element, so that extensive and highly complex circuits can be applied in the active surface 5. It has been shown, however, that mechanical problems occur, such as pattern shift. Pattern shift concerns the shifting of the aluminium wiring of an integrated circuit present at the surface 5 and is caused by thermal loading, because there is a clear difference in coefficient of expansion between the semiconductor element, for example, consisting of silicon, and the envelope, for example, consisting of epoxy resin. It may be assumed that, in the case of major shear stresses, a passivating coat of, for example, silicon nitride applied on the surface 5 can become torn at the area where the layer has a stepwise elevation in order to cover an aluminium track. The shear stress bearing on the aluminium track is then proportional to the width of this track and to the shear stress in situ. Both the shear stress and the width of the aluminium tracks are greatest at the edges of the semiconductor element (connection areas for wire connections and supply lines), so that pattern shift will occur most readily here.

A solution to this problem was sought in the application of a coating on the active surface of the semiconductor element. The active surface is then separated from the envelope of synthetic material. If the coating consists of a relatively soft synthetic material, such as a polymer coating, for example, a silicone coating, the problem of pattern shift no longer occurs. FIG. 2 diagrammatically represents a semiconductor device in which the semiconductor element is provided with "wafer coating". This means that the coating 6 is applied on the semiconductor wafer before this wafer is subdivided into individual semiconductor elements, for example, by means of sawing. A pattern is applied in which the connection areas 7 for the connection wires 4 yet to be applied and the cutting tracks 8 remain free from coating. It is also possible to apply the coating on each individual finished semiconductor device (chip coating), the entire surface of the semiconductor device being coated in that case. However, this is expensive. The descriptions following below are in principle also valid for semiconductor devices with chip coating).

FIG. 3 shows an example of the development of the shear stress $\sigma$ at the surface of the semiconductor element, both in a device according to FIG. 1 without coating, see the broken line A, and in a device according to FIG. 2 with coating, see the full line B. The distance R extends center of the semiconductor element to the edge. It can be clearly seen that the surface of the semiconductor element is free from shear stress when coating is used. A stress peak merely occurs where the synthetic material of the envelope is in contact with the semiconductor surface near a connection area 7 for the wire. Pattern shift does not occur any more owing to the use of the coating. However, another problem now arises. FIG. 4 gives an example of the displacement of the top of the coating relative to the semiconductor element, which is also the displacement of synthetic material in situ. This displacement V from the center of the semiconductor element toward its edge is now considerable. Major forces can be exerted on the wires 4 owing to this displacement. This can lead to wire fracture or tearing off of the wire connection at the connection area 7.

The invention eliminates the problem of pattern shift in such a way that tearing off of wire connections or breaking of wires will not occur. According to the invention, the coating is only applied in those areas where pattern shift could occur, which is near the periphery of the semiconductor element.

FIG. 5 diagrammatically shows a plan view of an embodiment of the invention comprising coating 9 applied on the semiconductor element 1. The dimensions are not drawn to scale for reasons of clarity. The coating 9 is present only near the circumference of the semiconductor element. The central portion of the semiconductor element is left free from coating, so that the synthetic envelope can adhere directly to the surface there. (No coating is present either on the connection areas 7 or the sawing lanes 8 in this embodiment for reasons stated above). The inner edge 10 of the coating is given an oval shape for practical reasons, but other shapes, for example rectangular, also achieve the effect of the invention. The smallest width D of the coating at the periphery of the semiconductor element may lie between wide limits. A width D of approximately 500 μm was found to be very suitable.

In FIG. 6, the development of the shear stress σ at the surface of the semiconductor element is shown. The broken line A represents the shear stress without coating, the full line C represents the shear stress with the peripheral coating of the present invention. It can be seen in the line C that the shear stress builds up slowly towards the edge of the semiconductor element. No pattern shift, however, occurs at these low values. The stress peak at the connection areas 7 for the wire is much lower than it is in the case of overall coating of the semiconductor element (see line B in FIG. 3). Pattern shift will definitely not occur in the embodiment according to the invention. The smallest width of the coating is designated with D in the graph.

FIG. 7 shows the displacement of the synthetic material of the envelope relative to the semiconductor element. A relatively small displacement occurs only near the circumference, which is due to the fact that the synthetic envelope adheres directly to the surface of the semiconductor element in the center of the semiconductor element. This relatively small displacement affecting the wires 4 can be easily accommodated by these wires; and tearing off of the wire connection and fracture of the wires cannot occur. The double effect, prevention of pattern shift and prevention of wire fracture or tearing off of wire connections, is achieved by means of the invention.

A relatively soft coating 9 is preferably used. This is a coating having an elasticity modulus (Young's modulus) of 100 MPa or less. Coatings having a higher elasticity modulus, however, may also be quite satisfactory. The material for the coating may, for example, be a polymer. A silicone coating has been found to be very suitable, but other materials can also be used. Coating thickness may vary between wide limits. The favourable effect of the invention renders it unnecessary for the coating to be particularly thin, for example less than 10 μm, so that the synthetic material of the envelope exerts forces on the wire connection point only. Greater values of, for example, 30 μm or more are admissible, since the forces on the wire remain limited owing to the (relatively small) displacement of the synthetic material.

It is indicated in the example according to the invention that the central portion of the semiconductor element remains free from coating. This is important as a starting point. If, however, for whatever reason, coating is applied over a comparatively small portion of the center, the principle of the invention remains fully intact.

We claim:

1. A semiconductor device having improved features of both shear stress relief and minimal connector damage, said device comprising a carrier member, at least one semiconductor element disposed on said carrier member, electrical connection areas near edges of an active surface of said semiconductor element opposite to said carrier member, electrical conductors disposed separate from said carrier member and said semiconductor element, wire elements connecting said connection areas to said electrical conductors, and an envelope of synthetic material disposed around said carrier member, said semiconductor element, and said wire elements, said electrical conductors extending exteriorly out of said envelope, wherein the improvement comprises a coating disposed only on a periphery of said active surface of said semiconductor element, said connection areas being at openings free of said coating to enable minimal connector damage, and said coating being electrically insulating and having an elasticity to absorb shear stresses between said active surface and said envelope at said connection areas, and wherein the improvement further comprises said coating being free of and surrounding a central area of said semiconductor element, said central area constituting a majority of said active surface, said active surface at said central area being disposed in direct contact with said envelope of synthetic material.

2. A semiconductor device according to claim 1, wherein said coating has a width dimension of approximately 500 μm from said edges of said active surface to said central area.

3. A semiconductor device according to claim 1, wherein said coating has an inner edge adjacent to said central area of said semiconductor element, said inner edge being in an oval shape, said oval shape having a shortest distance of approximately 500 μm from said inner edge to an outer edge of said coating.

4. A semiconductor device according to claim 1, wherein said edges of said active surface are free from said coating, said edges constituting scribing or sawing lanes of said semiconductor element.

5. A semiconductor device according to claim 1, wherein said coating has an elasticity modulus (Young's modulus) of less than 100 MPa.

6. A semiconductor device according to claim 1, wherein said coating consists of a polymer material.

7. A semiconductor device according to claim 1, wherein said coating consists of a silicone-based material.

8. A semiconductor device according to claim 1, wherein said coating has a thickness of at least 30 μm.

* * * * *